United States Patent [19]
Vaishampayan

[11] Patent Number: 6,160,505
[45] Date of Patent: Dec. 12, 2000

[54] METHOD AND APPARATUS FOR CONVERTING AN ANALOG SIGNAL TO A DIGITAL SIGNAL

[75] Inventor: Vinay A. Vaishampayan, Summit, N.J.

[73] Assignee: AT&T Corp, New York, N.Y.

[21] Appl. No.: 09/159,846

[22] Filed: Sep. 24, 1998

Related U.S. Application Data

[60] Provisional application No. 60/075,829, Feb. 24, 1998.

[51] Int. Cl.$^7$ .................................................. H03M 3/00
[52] U.S. Cl. ........................... 341/143; 341/155; 342/132
[58] Field of Search .................................. 341/143, 155; 332/117; 342/132, 128

[56] References Cited

U.S. PATENT DOCUMENTS

| | | | |
|---|---|---|---|
| 3,668,690 | 6/1972 | Ormond | 340/347 NT |
| 4,439,756 | 3/1984 | Shenoi et al. | 341/143 |
| 4,588,979 | 5/1986 | Adams | 341/143 |
| 5,251,218 | 10/1993 | Stone et al. | 370/120 |
| 5,495,432 | 2/1996 | Ho | 364/725 |
| 5,719,580 | 2/1998 | Core | 342/100 |

*Primary Examiner*—Peguy Jean Pierre

[57] ABSTRACT

A generalized frequency modulation (FM) based method for converting an analog signal to a digital signal. An analog input signal is sampled at the Nyquist rate. Each sample is converted to a corresponding modulated chirped FM signal. The digital signal is generated by sampling each modulated chirped FM signal at a rate which depends upon the bits per sample of the analog-to-digital (A/D) converter.

9 Claims, 3 Drawing Sheets

METHOD AND APPARATUS FOR CONVERTING AN ANALOG SIGNAL TO A DIGITAL SIGNAL

CROSS REFERENCES TO RELATED APPLICATIONS

This application claims the benefit of U.S. provisional application No. 60/075,829 filed Feb. 24, 1998, entitled "The Chirp A/D Converter: A New Approach to Achieving High Quality Digital Representations Using Single-Bit Quantizers."

FIELD OF THE INVENTION

The present invention relates generally to converting an analog signal to a digital signal. More particularly, the present invention relates to expanding the bandwidth of the analog signal prior to sampling and quantization through the use of a wideband chirp signal in order to achieve a greater effective conversion accuracy than would be possible by using the quantizer directly on samples of the analog signal.

BACKGROUND INFORMATION

Analog-to-digital (A/D) converters form a digital signal from an analog signal. The basic steps required to convert an analog signal to a digital signal include: 1) bandpass filtering the analog signal, 2) sampling values of the analog signal, 3) quantizing the sample values, and 4) encoding the sample values into digital words composed of binary digits (bits). The basic components used to execute these three steps respectively include: a sampler, a quantizer and an encoder.

The sampling step is typically accomplished by a device known as a sampler. The sampler extracts sample values (usually measured in volts) from the input analog signal at predetermined sampling times. Each sample value is held at a constant value until the next sampling instant. This constant value is input to the quantizer.

Quantization entails assigning each sample value to one of the finite number of output values (known as "quantization levels") available to the quantizer. For example, suppose a quantizer includes the following four quantization levels: 0.25 volts, 0.5 volts, 0.75 volts and 1.0 volt. The output of this quantizer is limited to one of these four values and each sample value input to this quantizer is assigned to one of these four quantization levels. If an input value is not equal to one of these four available quantization levels, the quantizer may "round" the input value to the closest of these four levels. Thus, an input of 0.5 volts may be assigned to a quantization level of 0.5 volts; an input value of 0.45 volts may also be assigned to a quantization level of 0.5 volts; and an input value of 0.1 volts may be assigned to a quantization level of 0.25 volts. As this example illustrates, rounding is a source of error in a quantizer's output. This error can be reduced by increasing the number of quantization levels within a given range of input values.

The encoder assigns each quantization level received from the quantizer to a corresponding digital word. Thus, an encoder connected to the quantizer described above would include one unique digital word which corresponds to each of the four quantization levels. The digital word assigned to 0.25 volts might be "00"; the digital word assigned to 0.50 volts might be "10"; the digital word assigned to 0.75 volts might be "01"; and the digital word assigned to 1.0 volt might be "11". The relationship between the number of quantization levels and the length of the digital word required to uniquely represent each quantization level is given by the following expression:

$$q=2^n$$

where "q" is the number of quantization levels and "n" is the number of bits in each digital word. Thus, to represent each of four quantization levels with a unique digital word, two bit ($2^2$) digital words are required.

The "pipelined" or "successive approximation" converter is a known type of A/D converter. Successive approximation A/D converters utilize a single-bit quantizer to achieve multi-bit precision. In a successive approximation A/D converter, a comparator compares the input analog value to a predetermined voltage level (such as zero volts) and generates a digital "1" if the input value is greater than the predetermined voltage or generates a digital "0" if the input value is less than the predetermined voltage. This digital "1" or "0" is the first bit in the digital word which represents the input analog sample value. After this first bit is stored, this digital value is converted back to an analog signal using a digital-to-analog (D/A) converter so the signal may be used in the process of determining the second bit in the digital word which represents the same sample value. For example, a digital "1" is converted to a 1 volt analog signal and a digital "0" is converted to a negative 1 volt analog signal. A new input voltage to the A/D converter is then obtained by doubling the previous input voltage and subtracting off the D/A signal. The above process is repeated until the desired number of bits are obtained (for a given input sample).

The major advantages of the successive approximation architecture are a small chip area and low power consumption. However, since successive approximation A/D converters require a D/A converter in a feedback loop, it is necessary to wait for the output of the D/A converter to "settle" before the next bit can be obtained. The time required for settling restricts the speed of the A/D converter. All known A/D converters which use single-bit quantization to achieve multi-bit accuracy rely on feedback from the previous quantizer output.

In view of the above, it can be appreciated that there is a need for a method and apparatus which solves the above mentioned problems.

SUMMARY OF THE INVENTION

According to an embodiment of the present invention, a method for converting an analog signal to a digital signal is provided. First, the analog signal is received and sampled. The analog signal samples are then used to modulate a wideband signal. Next, the modulated wideband signal is sampled. Finally, the modulated wideband signal samples are quantized to create the digital signal.

DETAILED DESCRIPTION

Typical analog-to-digital (A/D) converters sample an input analog signal at a fixed sampling rate and measure the amplitude of each sample prior to determining the digital word which corresponds to each sample. Rather than directly measuring the amplitude of each sample, the present invention converts each sample to a continuous-time wideband signal. The information about the amplitude of each sample is embedded in the pattern of zero crossings (discussed in greater detail below) of the modulated wideband signal. The digital word corresponding to each sample is obtained by processing sign information of the wideband signal. According to one embodiment of the present invention, the conversion steps include: 1) sampling an input analog signal (e.g., at the Nyquist rate), modulating a wideband signal such as a chirped frequency modulation (FM) signal with each sample from the input analog signal, sampling each modulated chirped FM signal, and quantizing each modulated chirped FM signal using a quantizer such as a single-bit quantizer.

Figure 1:
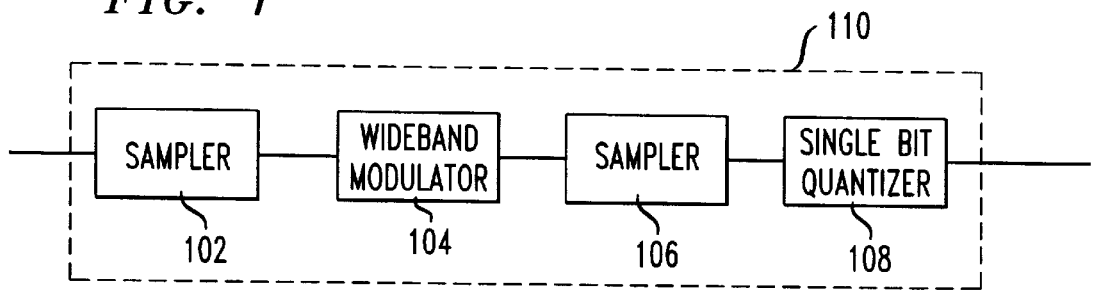
FIG. 1 is a general block diagram of an A/D converter suitable for practicing one embodiment of the present invention.

FIG. 1 is a general block diagram of an A/D converter suitable for practicing one embodiment of the present invention. In FIG. 1, an A/D converter 110 is illustrated. A/D converter 110 comprises a sampler 102 which is adapted to receive an analog signal. Sampler 102 may include, for example, a sampling clock with a clock frequency represented by the relationship $f_s=1/\tau$, where $\tau$ is the sampling interval. A wideband modulator 104 is adapted to be connected to sampler 102. Wideband modulator 104 modulates a wideband signal using the samples received from sampler 102. A sampler 106 is adapted to be connected to wideband modulator 104. Sampler 106 is used to sample the modulated wideband output signal received from wideband modulator 104. The sampling rate of sampler 106 is dependent upon the number of bits per sample for A/D converter 110. For example, sampler 106 may include a sampling clock with a frequency "r" times faster than sampler 102 where "r" is the number of bits per sample for the A/D converter. A quantizer 108, such as a single-bit quantizer, is adapted to be connected to sampler 106. Single-bit quantizer 108 creates the digital signal by quantizing the samples received from sampler 106.

The operation of A/D converter 110 will now be described with reference to FIG. 1. First, an analog signal, "x(t)" is bandlimited (in a known manner) to W Hertz (Hz) (where $W \leq 1/(2\tau)$) and input to sampler 102. Sampler 102 samples x(t) and generates a step signal s(t) which may be represented by the following relationship:

$$s(t) = \sum_n x_n p(t - n\tau)$$

where we assume for the sake of describing the invention that $0 \leq x_n \leq 1$, though this restriction is not necessary; and where $$p(t) = \begin{cases} 1, & 0 \leq t < \tau \\ 0, & \text{elsewhere.} \end{cases}$$

In this example, the step signal essentially consists of a series of amplitude values obtained by sampling x(t). Sampler 102 sends this step signal to wideband modulator 104.

Upon receiving the step signal, wideband modulator 104 sequentially uses each sample value within the step signal received from sampler 102 to modulate a wideband signal. Thus, the signal output from wideband modulator 104 consists of a series of non-overlapping modulated wideband signals where each modulated wideband signal corresponds to a sample received from sampler 102. The series of modulated wideband signals, f(t), generated by wideband modulator 104 may be represented by the following relationship:

$$f(t) = \sum_n f^*(x_n, t - n\tau),$$

where $$f^*(x, t) = \begin{cases} 2^{-rt/\tau} \cos(2^{rt/\tau} x\pi/2), & 0 < t \leq \tau \\ 0, & \text{elsewhere} \end{cases}$$

and where r=the number of bits/sample for the A/D converter.

In the preferred embodiment, the wideband signal is an exponentially chirped frequency modulation (FM) signal. An example of the differential equations implemented by wideband modulator 104 to generate the series of modulated exponentially chirped FM signals may be expressed as follows:

$$\frac{d}{dt} f^*(x, t) = -Af^*(x, t) - Aca(t)g^*(x, t)$$

$$\frac{d}{dt} g^*(x, t) = -Ag^*(x, t) + Aca(t)f^*(x, t)$$

for $0 < t \leq \tau$; subject to these initial conditions:

$$f^*(x, 0) = \cos(c)$$

$$g^*(x, 0) = \sin(c)$$

where $A=(r \ln 2)/\tau$; $c=x\pi/2$; and $a(t)=2^{rt/\tau}$. The solution to the above set of differential equations is given by:

$$f^*(x, t) = 2^{-rt/\tau} \cos(2^{rt/\tau} x\pi/2)$$

and $$g^*(x, t) = 2^{-rt/\tau} \sin(2^{rt/\tau} x\pi/2)$$

for $0 < t \leq \tau$. Examples of circuits which may be included within wideband modulator 104 to implement the above differential equations will be discussed in greater detail below.

Figure 2:
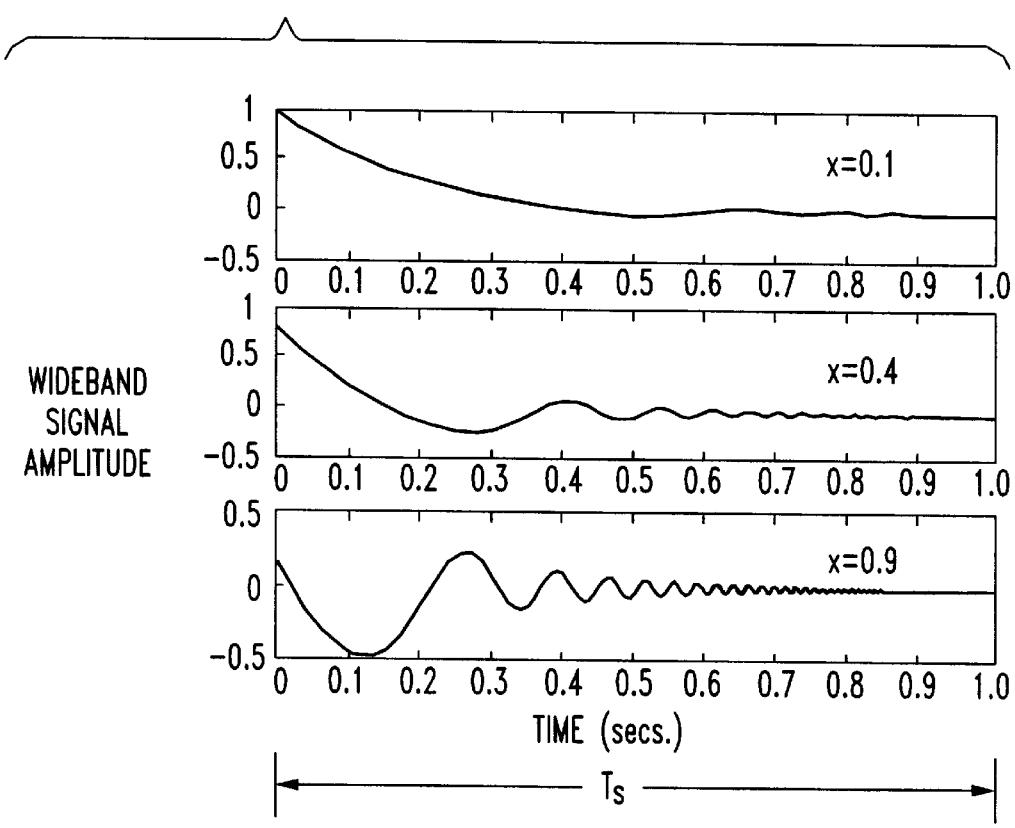
FIG. 2 illustrates three examples of a modulated exponentially chirped frequency modulation (FM) signal in accordance with an embodiment of the present invention.

FIG. 2 illustrates three examples of a modulated exponentially chirped FM signal in accordance with an embodiment of the present invention. The three signals of FIG. 2 result from modulating an exponentially chirped FM signal using three different values sampled from an analog signal (x=0.1 (top), x=0.4 (middle) and x=0.9 (bottom)). In each of the three graphs of FIG. 2, the amplitude of the modulated signal is indicated along the vertical axis and time is indicated along the horizontal axis. The time interval from "0" to "1" (indicated along the horizontal axis of each of the three graphs of FIG. 2) represents the sampling interval ($\tau$) for the A/D converter used to generate these three signals.

As illustrated by comparing each of the three graphs of FIG. 2, the zero-crossings (defined as points in time when the amplitude of the modulated wideband signal crosses an amplitude of zero) shift to the left along the horizontal axis as the value of the analog input sample "x" increases from 0.1 to 0.9. Thus, when observed during the sampling interval (0, τ], each input sample may be represented by a unique waveform after the sample is used to modulate the exponentially chirped FM signal.

As mentioned previously, the output of wideband modulator 104 is a series of modulated wideband signals such as those illustrated in FIG. 2. Each modulated wideband signal uniquely represents a corresponding amplitude value received from sampler 102.

Wideband modulator 104 sends this series of modulated wideband signals to sampler 106. In this embodiment, sampler 106 then samples each modulated signal "r" times and the sign of each of these samples is used to determine the digital word which corresponds to each modulated signal. Thus, in this example, sampler 106 includes a sampling clock which samples at a rate "r" times faster than the sampling clock within sampler 102. As mentioned previously, "r" represents the predetermined number of bits per sample of the A/D converter. Sampler 106 then sends these sample values to single-bit quantizer 108.

Figure 3:
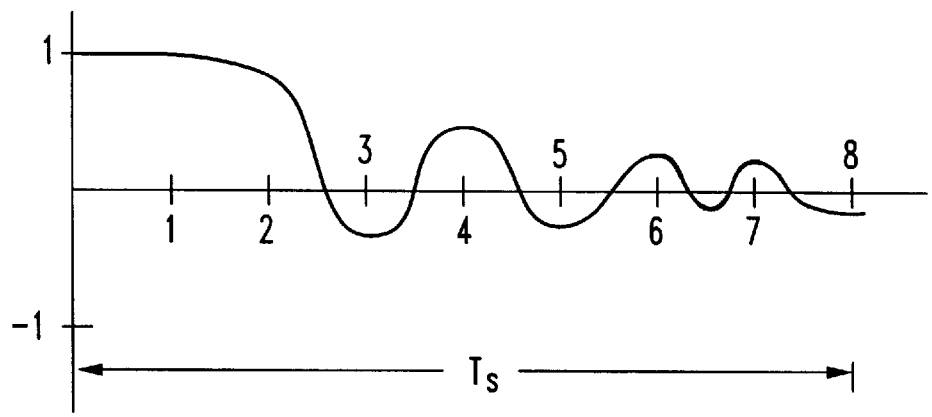
FIG. 3 illustrates the top signal of FIG. 2, in accordance with an embodiment of the present invention.

An example of the method sampler 106 and quantizer 108 may use to determine the digital word which corresponds to a particular modulated exponentially chirped FM signal will now be described with reference to FIG. 3. FIG. 3 illustrates the top signal of FIG. 2, in accordance with an embodiment of the present invention. For the purpose of this example, assume sampler 106 is included within an 8-bit A/D converter (r=8). An 8-bit A/D converter represents each analog signal sample with an 8-bit digital word. To determine the 8 bits which represent the modulated signal of FIG. 3, sampler 106 samples the modulated signal 8 times within the sampling interval τ. These 8 sampling points are indicated along the horizontal axis of FIG. 3.

At each of the 8 sampling points of FIG. 3, single-bit quantizer 108 first determines whether the amplitude of the modulated signal is greater than or less than zero. If the amplitude value of the modulated signal is greater than zero at a particular sampling point, the corresponding bit in the resulting digital word will be set to "1". If the amplitude value of the modulated signal is less than zero at a particular sampling point, the corresponding bit in the digital word will be set to "0". In FIG. 3, the amplitude value of the modulated signal is greater than zero at the first sampling point. Thus, the first bit in the 8-bit binary word which represents this modulated signal will be set to a "1". The amplitude value of the modulated signal at the second sampling point is also greater than zero. Thus, the second bit in the 8-bit binary word which corresponds to this modulated signal will be set to "1". The amplitude value of the modulated signal at the third sampling point is less than zero, thus the third bit will be set to "0". The above steps are repeated at each of the remaining 5 sampling points indicated in FIG. 3 to determine the 8 bits of the digital word which uniquely represents this particular modulated signal.

The advantage of using an exponentially chirped FM signal in the preferred embodiment of the present invention will now be explained. As illustrated in FIG. 2, each distinct value of the input sample ("x") results in a modulated wideband signal with a distinct pattern of zero crossings. Each modulated wideband signal, in turn, results in a binary word of "r" bits. As "x" varies from 0 to 1, it is desirable that all possible $2^r$ r-bit binary words be generated. Further, it is also desirable that if $x_1$ and $x_2$ result in the same r-bit binary word, then any value of x that lies between $x_1$ and $x_2$ also result in the same r-bit binary word. This is made possible by using an exponentially chirped signal for the wideband signal.

The output signal generated by sampler 106 may be described as follows:

$$v(t) = \sum_n f(n\tau/r)p_1(t - n\tau/r),$$

where $$p(t) = \begin{cases} 1, & 0 < t \leq \tau/r, \\ 0, & \text{elsewhere,} \end{cases}$$

and f(t), is the modulated wideband signal given by $$f(t) = \sum_n f^*(x_n, t - n\tau).$$

The signal, v(t), is the input to single bit quantizer 108. The output of single bit quantizer 108 is a stream of bits obtained as follows. The "nth" bit of the "mth" r-bit word is $b_{n,m}$ is given by:

$$b_{n,m} = \begin{cases} 1, & v(m\tau + n\tau/r) > 0, \\ 0, & \text{otherwise,} \end{cases}$$

where n may take on values 1, 2, . . . , r and m is an integer.

The word ($b_{1,m}$, $b_{2,m}$, . . . , $b_{r,m}$) is the desired digital representation of the mth sample $x_m$.

Figure 4:
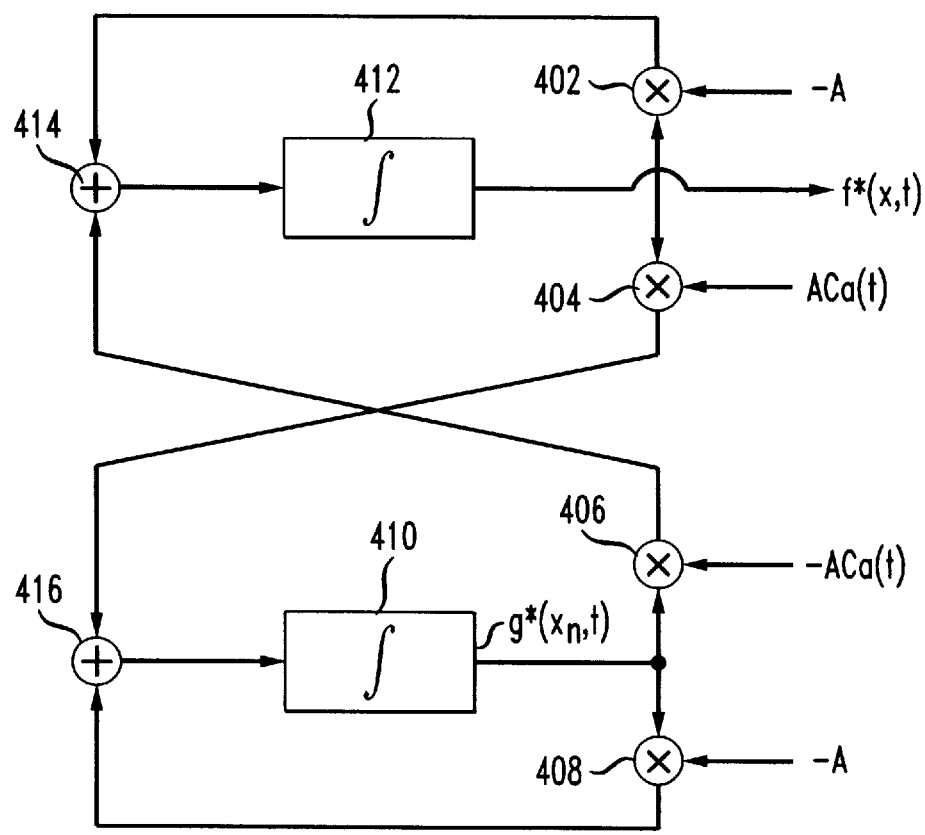
FIG. 4 illustrates an example of a circuit which implements differential equations to generate modulated exponentially chirped FM signals, in accordance with an embodiment of the present invention.

FIG. 4 shows an example of a circuit which implements differential equations to generate modulated exponentially chirped FM waveforms, in accordance with an embodiment of the present invention. The circuit of FIG. 4 may be included within wideband modulator 104 to implement the above described differential equations. In FIG. 4, an integrator 412 is coupled to a multiplier 402, a multiplier 404 and an adder 414. Multiplier 402 is coupled to adder 414. Multiplier 404 is coupled to an adder 416. Multiplier 402 is coupled to multiplier 404. An integrator 410 is coupled to adder 416, a multiplier 406 and a multiplier 408. Multiplier 406 is coupled to adder 414. Multiplier 408 is coupled to adder 416.

The example circuit of FIG. 4 directly implements the above mentioned differential equations. The output signal from this circuit may be expressed in terms of the following relationship:

$$f^*(x, t) = 2^{-rt/\tau} \cos(2^{rt/\tau} x\pi/2).$$

This output is obtained by beginning circuit operation at t=0 and ending at t=τ subject to the following initial conditions:

$$f^*(x, 0) = \cos(c)$$

$$g^*(x, 0) = \sin(c),$$

where c=xπ/2. As indicated in FIG. 4, opposite polarity versions of each sample within the step signal generated by sampler 102 are input to multipliers 404 and 406. Each sample input to the circuit of FIG. 4 results in a modulated version of an exponentially chirped FM signal. Each modulated signal has a duration=τ seconds.

Figure 5:
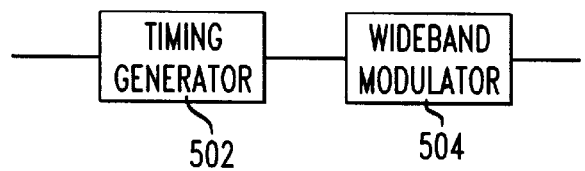
FIG. 5 illustrates another example of a circuit which implements differential equations to generate modulated exponentially chirped FM signals, in accordance with an embodiment of the present invention.

FIG. 5 shows a general block diagram of another example of a circuit which implements differential equations to generate modulated exponentially chirped FM signals, in accordance with an embodiment of the present invention. The circuit of FIG. 5 may be included within wideband modulator 104 to implement the above described differential equations. In FIG. 5, a timing generator 502 is adapted to be connected to a wideband modulator 504. Timing generator 502 is adapted to receive sample values from a sampler such as sampler 102. Wideband modulator 504 may include, for example, the circuit of FIG. 4 set to certain initial conditions as described below.

Rather than directly implementing the above differential equations (as with the example circuit of FIG. 4), the circuit of FIG. 5 is based upon the observation (previously mentioned in reference to FIG. 2) that the zero crossings (within the sampling interval $\tau$) of the modulated wideband signal generated for a particular value of x<1 are obtained as shifts of the zero crossings of the wideband signal generated when x=1. Observe that this signal:

$$f^\sim(x, t) = \begin{cases} q(t), & 0 < t < (\tau/r)\log_2(1/x) \\ f^*(1, t - (\tau/r)\log_2(1/x)), & (\tau/r)\log_2(1/x) \le t < \tau \end{cases}$$

where q(t) is any positive function having the same zero crossings as the signal f*(x, t). Thus, each input sample may be uniquely represented by a corresponding modulated signal if the same exponentially chirped FM signal is delayed by a period of time that depends on the value of the input sample. In FIG. 5, wideband modulator 504 begins generating the modulated output signal upon receiving a signal from timing generator 502. Thus, timing generator 502 ensures wideband modulator 504 delays generating the output signal for a time period related to the value of the corresponding input sample.

Figure 6:
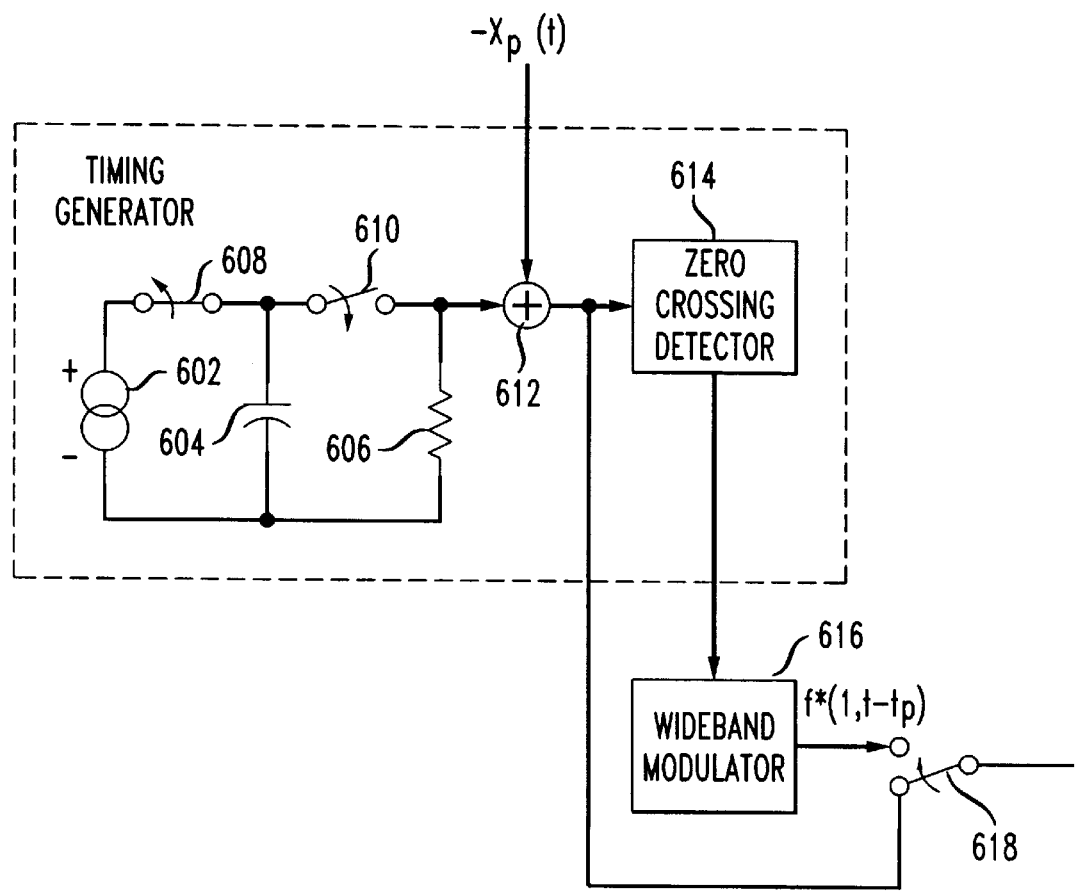
FIG. 6 illustrates a more specific example of the circuit of FIG. 5, in accordance with an embodiment of the present invention.

FIG. 6 illustrates a more specific example of the circuit of FIG. 5, in accordance with an embodiment of the present invention. The circuit of FIG. 6 may be included within wideband modulator 104 to implement the above described differential equations. In FIG. 6, a voltage source 602 is coupled in parallel with a capacitor 604 and a resistor 606. The relationship between capacitor 604 and resistor 606 may be expressed by the following relationship: $RC=\tau/(r\log_e 2)$. A switch 608 is coupled in series between voltage source 602 and capacitor 604. A switch 610 is coupled in series between capacitor 604 and resistor 606. An adder 612 is coupled to an output of switch 610 and adapted to receive an input voltage signal. A zero crossing detector 614 is coupled to an output of adder 612. A wideband modulator 616 is coupled to an output of zero crossing detector 614. A switch 618 is selectively coupled to an output of wideband modulator 616 and an output of adder 612.

In the embodiment of FIG. 6, wideband modulator 616 includes the circuit of FIG. 4 set to the following initial conditions:

$$f^*(x, 0)=\cos(\pi/2)=0; \ g^*(x, 0)=\sin(\pi/2)=1.$$

These initial conditions ensure wideband modulator 616 generates the appropriate exponentially chirped FM signal when triggered by zero crossing detector 614. To initialize the circuit of FIG. 6, switch 618 is set to select the output of adder 612, switch 608 is closed, switch 610 is opened and capacitor 604 is charged to +1 volt by voltage source 602. At time t=0, the following events occur: 1) the first sample value from within the step signal generated by sampler 102 is input to adder 612 (as indicated in FIG. 6, the polarity of this first sample value is made negative in a known manner prior to being input to adder 612), 2) switch 608 is opened, 3) switch 610 is closed causing capacitor 604 to begin discharging, and 4) switch 618 selects the output of adder 612. The signal output from adder 612 represents the sum of the negative input sample voltage signal and the voltage signal received from capacitor 604. As mentioned above, the absolute value of each input sample voltage ($x_n$) is assumed to be between 0 and 1. As the voltage stored in capacitor 604 discharges, the value of the voltage across capacitor 604 diminishes from +1 volt to 0. At time $t_p$, the sum of the negative input sample voltage and the capacitor voltage will equal zero. This time point may be expressed using the following relationship:

$$t_p=(\tau/r)\log_2(1/x_n).$$

Upon receiving a zero voltage signal from adder 612, zero crossing detector 614 sends a pulse to wideband modulator 616 and switch 618 selects the output of wideband modulator 616. Wideband modulator 616 begins generating the modulated output waveform when the pulse is received from zero crossing detector 614. As desired, the time point ($t_p$) when wideband modulator 616 begins generating the modulated signal depends upon the value of the corresponding sample.

Although various embodiments are specifically illustrated and described herein, it will be appreciated that modifications and variations of the present invention are covered by the above teachings and within the purview of the appended claims without departing from the spirit and intended scope of the invention. For example, although one described embodiment utilizes an exponentially chirped FM signal, other wideband signals with a time varying spectral content may also be utilized. Examples of these other wideband signals include: FM signals, linearly chirped signals, polynomially chirped signals, and exponentially chirped signals.

Additionally, the use of modulated wideband signals which overlap in time (i.e, signals which have a duration greater than the sampling interval ($\tau$)) rather than non-overlapping modulated wideband signals is within the scope of the present invention. Further, sampling of the input analog signal may be accomplished at a rate greater than the Nyquist sampling rate. Such oversampling may be accomplished in conjunction with processing of the wideband modulated output signal in the analog domain (e.g., by multiplying the wideband modulator signals together prior to resampling and quantization). Finally, rather than generating one signal which corresponds to each analog sample, the wideband modulator may generate multiple signals corresponding to each analog signal sample.

What is claimed is:

1. A method for converting an analog signal to a digital signal, comprising the steps of:

receiving the analog signal;

sampling the analog signal;

modulating a wideband signal using said analog signal samples;

sampling said modulated wideband signal; and quantizing said modulated wideband signal samples to create the digital signal.

2. The method of claim 1, wherein said wideband signal is a signal selected from the group consisting of exponentially chirped frequency modulation (FM) signals, FM signals, linearly chirped signals, polynomially chirped signals, exponentially chirped signals, and signals with a time varying spectrum.

3. The method of claim 1, wherein said quantizing step comprises:

determining an amplitude value of said wideband signal at each sample point; and converting each amplitude value to a binary digit.

4. The method of claim 1, wherein a rate used to sample said wideband signal depends on a bit per sample rate of an analog to digital converter.

5. A circuit for converting an analog signal to a digital signal, comprising:
- a first sampler adapted to receive the analog signal, said first sampler having an output generating a set of first samples for the analog signal;
- a wideband modulator having an input connected to said output of said first sampler, said input of said wideband modulator receiving said first set of samples, said wideband modulator having an output generating a series of wideband signals modulated using said first set of samples;
- a second sampler having an input connected to said output of said wideband modulator, said second input of said sampler receiving said modulated wideband signals, said second sampler having an output generating a second set of samples for said modulated wideband signals; and
- a quantizer having an input connected to said output of said second sampler, said input of said quantizer receiving said second set of samples and generating the digital signal by quantizing said second set of samples;
- wherein said wideband modulator further comprises:
  - a timing generator; and
  - a second wideband modulator adapted to be connected to said timing generator.

6. The circuit of claim 5, wherein said timing generator further comprises:
- a voltage source;
- a capacitor coupled in parallel with said voltage source;
- a resistor coupled in parallel with said capacitor;
- a first switch coupled in series between said voltage source and said capacitor;
- a second switch coupled in series between said capacitor and said resistor;
- an adder having a first input, a second input and an output, said first input of said adder adapted to receive an input voltage signal, said second input of said adder coupled to an output of said second switch;
- a zero crossing detector having an input coupled to said output of said adder and having an output;
- a wideband modulator having an input coupled to said output of said zero crossing detector and having an output; and
- a third switch selectively coupled to said output of said wideband modulator and said output of said adder; said third switch adapted to output a modulated wideband signal which corresponds to said input voltage signal.

7. The circuit of claim 6, wherein said second wideband modulator further comprises:
- a first integrator having an input and an output, said first integrator output adapted to output a modulated wideband signal which corresponds to a first input voltage signal;
- a first multiplier having a first input coupled to said output of said first integrator, a second input adapted to receive a second input voltage and an output;
- a second multiplier having a first input coupled to said output of said first integrator and said first input of said first multiplier, a second input adapted to receive said first input voltage signal, and an output;
- a first adder having a first input coupled to said output of said first multiplier, an output coupled to said input of said first integrator and a second input;
- a second integrator having an input and an output;
- a third multiplier having a first input adapted to receive a negative version of said first input voltage, a second input coupled to said output of said second integrator, and an output coupled to said second input of said first adder;
- a fourth multiplier having a first input adapted to receive said second input voltage, a second input coupled to said output of said second integrator and said second input of said third multiplier, and an output; and
- a second adder having a first input coupled to said output of said second multiplier, a second input coupled to said output of said fourth multiplier, and an output coupled to said input of said second integrator.

8. A circuit for converting an analog signal to a digital signal, comprising:
- a first sampler adapted to receive the analog signal, said first sampler having an output generating a set of first samples for the analog signal;
- a wideband modulator having an input connected to said output of said first sampler, said input of said wideband modulator receiving said first set of samples, said wideband modulator having an output generating a series of wideband signals modulated using said first set of samples;
- a second sampler having an input connected to said output of said wideband modulator, said input of said second sampler receiving said modulated wideband signals, said second sampler having an output generating a second set of samples for said modulated wideband signals; and
- a quantizer having an input connected to said output of said second sampler, said input of said quantizer receiving said second set of samples and generating the digital signal by quantizing said second set of samples.

9. A circuit for converting an analog signal to a digital signal, comprising:
- a first sampler adapted to receive the analog signal, said first sampler having an output generating a set of first samples for the analog signal;
- a wideband modulator having an input connected to said output of said first sampler, said input of said wideband modulator receiving said first set of samples, said wideband modulator having an output generating a series of wideband signals modulated using said first set of samples;
- a second sampler having an input connected to said output of said wideband modulator, said second input of said sampler receiving said modulated wideband signals, said second sampler having an output generating a second set of samples for said modulated wideband signals; and
- a quantizer having an input connected to said output of said second sampler, said input of said quantizer receiving said second set of samples and generating the digital signal by quantizing said second set of samples;
- wherein said wideband modulator further comprises:
  - a first integrator having an input and an output, said output of said first integrator adapted to output a modulated wideband signal which corresponds to a first input voltage signal;
  - a first multiplier having a first input coupled to said output of said first integrator, a second input adapted to receive a second input voltage and an output;
  - a second multiplier having a first input coupled to said output of said first integrator and said first input of said first multiplier, a second input adapted to receive said first input voltage signal, and an output;

a first adder having a first input coupled to said output of said first multiplier, an output coupled to said input of said first integrator and a second input;

a second integrator having an input and an output;

a third multiplier having a first input adapted to receive a negative version of said first input voltage, a second input coupled to said output of said second integrator, and an output coupled to said second input of said first adder;

a fourth multiplier having a first input adapted to receive said second input voltage, a second input coupled to said output of said second integrator and said second input of said third multiplier second, and an output; and a second adder having a first input coupled to said output of said second multiplier, a second input coupled to said output of said fourth multiplier, and an output coupled to said input of said second integrator.

* * * * *